United States Patent
Tseng et al.

(10) Patent No.: US 8,723,552 B2
(45) Date of Patent: May 13, 2014

(54) CONFIGURATION AND METHOD FOR IMPROVING NOISE IMMUNITY OF A FLOATING GATE DRIVER CIRCUIT

(75) Inventors: Pei-Kai Tseng, Keelung (TW); Chien-Fu Tang, Hsinchu (TW); Kuang-Feng Li, Changhua County (TW); Isaac Y. Chen, Hsinchu County (TW)

(73) Assignee: Richtek Technology Corp., Chupei, Hsinchu (TW)

( * ) Notice: Subject to any disclaimer, the term of this patent is extended or adjusted under 35 U.S.C. 154(b) by 0 days.

(21) Appl. No.: 13/413,325

(22) Filed: Mar. 6, 2012

(65) Prior Publication Data

US 2012/0229165 A1    Sep. 13, 2012

(30) Foreign Application Priority Data

Mar. 11, 2011 (TW) .............................. 100108384 A

(51) Int. Cl.
*H03K 19/0175*  (2006.01)
*G05F 1/00*  (2006.01)

(52) U.S. Cl.
USPC ............... 326/82; 326/68; 323/282; 327/109; 327/381

(58) Field of Classification Search
USPC ................ 326/82, 83, 68; 327/109, 381, 427; 323/282
See application file for complete search history.

(56) References Cited

U.S. PATENT DOCUMENTS

| | | | |
|---|---|---|---|
| 5,552,731 A * | 9/1996 | Diazzi et al. | 327/109 |
| 6,646,469 B2 * | 11/2003 | Yushan | 326/83 |
| 7,719,325 B1 * | 5/2010 | Wang et al. | 327/112 |

* cited by examiner

*Primary Examiner* — Daniel D Chang
(74) *Attorney, Agent, or Firm* — Muncy, Geissler, Olds & Lowe, P.C.

(57) ABSTRACT

A floating gate driver circuit includes a level shifter, a pass element, a bistable circuit and a control logic circuit, to shift the voltage level of a control signal from a lower one to a higher one. The level shifter or the pass element has loads dynamically controlled by the control logic circuit to filter malfunction caused by dv/dt noise induced by a floating node.

32 Claims, 10 Drawing Sheets

US 8,723,552 B2

CONFIGURATION AND METHOD FOR IMPROVING NOISE IMMUNITY OF A FLOATING GATE DRIVER CIRCUIT

FIELD OF THE INVENTION

The present invention is related generally to a floating gate driver circuit and, more particularly, to a configuration and method for improving noise immunity of a floating gate driver circuit.

BACKGROUND OF THE INVENTION

In high-voltage applications such as motors, ballasts, dual-inductor single-capacitor converters (LLC) and cold cathode fluorescent lamp (CCFL), it is required to convert certain logic signals from low voltage to high voltage in order to control the high-voltage components. For example, in a floating gate driver circuit as shown in FIG. 1, control signals UG and LG are used to switch serially connected power switches PSW1 and PSW2 between a high-voltage terminal VH and a ground terminal GND. The direct-current (DC) input voltage VH is very high, maybe up to 300-600V or above, while the control signals UG and LG are generated by a logic circuit with reference to ground, and thus the control signal UG for the high-side power switch PSW1 must be shifted to an appropriate level. This level shift is accomplished by using a pulse generator 10 responsive to the control signal UG to generate short-pulse signals Set and Reset for a level shifter 12 to control its output voltages V1 and V2, through inverters 15 and 16 respectively, to control a bistable circuit 18, e.g. an RS flip-flop, to thereby generate a control signal Q for a driver 20 to apply a voltage OH to the control terminal of the power switch PSW1. The level shifter 12 is established with two branch circuits, one including an NMOSFET M1 to generate the voltage V1 at the output terminal AA under the control of the signal Set, and the other including an NMOSFET M2 to generate the voltage V2 at the output terminal BB under the control of the signal Reset. A resistor R1 is connected between a power supply terminal Vc and the output terminal AA to serve as the load of the NMOSFET M1, and a resistor R2 is connected between the power supply terminal Vc and the output terminal BB to serve as the load of the NMOSFET M2. Clamping circuits 13 and 14, including Zener diodes D1 and D2 respectively, are additionally shunt to the resistors R1 and R2 respectively, to clamp the voltages V1 and V2 not lower than certain values. The clamping circuits 13 and 14 may be implemented by other components or circuits alternatively. The bistable circuit 18 uses the inverted signals of the voltages V1 and V2 as its set signal S and the reset signal R, respectively, to define the control signal Q. When the control signal UG is changed from logical low to logical high, the pulse generator 10 triggers the short-pulse signal Set to turn on the NMOSFET M1, thereby pulling down the voltage V1 and as a result, the output signal S of the inverter 15 is changed to a high level and triggers the control signal Q, which in turn causes the driver 20 to turn on the power switch PSW1. When the control signal UG is changed from logical high to logical low, the pulse generator 10 triggers the short-pulse signal Reset to turn on the NMOSFET M2, thereby pulling down the voltage V2 and as a result, the output signal R of the inverter 16 is changed to a high level and thus turns off the control signal Q, which in turn causes the driver 20 to turn off the power switch PSW1.

The bistable circuit 18 and the driver 20 use the voltage at the floating node S1 between the power switches PSW1 and PSW2, rather than the voltage at the ground terminal GND, as the reference potential of the circuits. The driver 20 has its positive power supply terminal 22 connected to the power supply terminal Vc, and its negative power supply terminal 24 connected to the floating node S1. Likewise, the bistable circuit 18 has its positive power supply terminal 26 connected to the power supply terminal Vc, and its negative power supply terminal 28 connected to the floating node S1. When the power switches PSW1 and PSW2 are switched, voltage variation dv/dt occurs at the floating node S1. The dv/dt noise is introduced to the power supply terminal Vc via the bootstrap capacitor Cb connected between the power supply terminal Vc and the floating node S1, and may lead to an incorrect control signal Q to turn on or off the power switch PSW1 by mistake. The erroneous switching of the power switch PSW1 is caused by parasitic capacitors C1 and C2 at the output terminals AA and BB of the level shifter 12. A transient change in the voltage Vc induces a current I1 in the resistor R1 and a current I2 in the resistor R2 that charge or discharge the parasitic capacitors C1 and C2, respectively. As a result, the voltages V1 and V2 are varied so significantly that the logic state of the set signal S and the reset signal R is changed, and an incorrect operation ensues.

U.S. Pat. No. 5,552,731 proposes an improved circuit as shown in FIG. 2, which replaces the inverters 15 and 16 shown in FIG. 1 by a pass element 30 to prevent from incorrect operation caused by the dv/dt noise. In the pass element 30, a pair of cross-coupled PMOSFETs M3 and M4 have their input terminals connected to the output terminals BB and AA of the level shifter 12, respectively, and their output terminals connected to the input terminals S and R of the bistable circuit 18, respectively, and resistors R3 and R4 serve as the loads of the PMOSFETs M3 and M4, respectively. When the NMOSFET M1 is turned on by the short-pulse signal Set, the output voltage V1 is pulled down such that the PMOSFET M3 is turned on. Consequently, the resistors R2 and R3 become a divider to divide the voltage Vc−S1, thereby pulling up the set signal S to trigger the control signal Q. When the NMOSFET M2 is turned on by the short-pulse signal Reset, the output voltage V2 is pulled down such that the PMOSFET M4 is turned on. Consequently, the resistors R1 and R4 become a divider to divide the voltage Vc−S1, thereby pulling up the reset signal R to turn off the control signal Q. In order for the set signal S to go to logic 0 sooner than the reset signal R at the time of terminating the control signal Q, the resistor R4 must have a greater resistance than the resistor R3 so that the input terminal S of the bistable circuit 18 can be discharged at a higher speed than the input terminal R. To ensure that the foregoing goal is achievable, U.S. Pat. No. 5,572,156 further provides a switch shunt to the resistor R3 and controlled by the reset signal R.

In these arts, the level shifter 12 uses the resistors R1 and R2 as the loads, and the RC response times of the resultant R1C1 network and of the R2C2 network are fixed; therefore, dynamic control is difficult to attain. The pass element 30, on the other hand, uses the resistors R3 and R4 as the loads, and thus the fixed resistances of the resistors R3 and R4 also make it difficult to filter out the dv/dt noise by dynamic control. Moreover, since both the set signal S and the reset signal R are generated by a resistor voltage divider, the resistances of the resistors R1, R2, R3 and R4 are subject to strict limitations so as to generate the set signal S and the reset signal R of the appropriate levels. This, however, reduces the flexibility in circuit design.

SUMMARY OF THE INVENTION

An objective of the present invention is to provide an improved noise immunity floating gate driver circuit.

Another objective of the present invention is to provide a method for improving noise immunity of a floating gate driver circuit.

According to the present invention, a floating gate driver circuit includes a level shifter with a clamping circuit, a pass element, a bistable circuit and a control logic circuit, to shift the voltage level of a control signal from a low voltage to a high voltage, and to dynamically control the loads of the pass element so that the two input terminals of the bistable circuit have different voltage decreasing or increasing speeds at the time of terminating the control signal, to prevent erroneous triggering of the control signal.

Preferably, current sources, transistors or programmable impedance devices are used as the loads of the pass element.

Preferably, the loads of the level shifter are dynamically controlled to minimize the time of influence of the dv/dt noise at the time of triggering the control signal.

According to the present invention, a floating gate driver circuit includes a level shifter with a clamping circuit, a pass element, a bistable circuit and a control logic circuit. The loads of the pass element include two current sources to provide different currents so that the two input terminals of the bistable circuit have different voltage decreasing or increasing speeds at the time of terminating the control signal, to prevent erroneous triggering of the control signal.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 2:
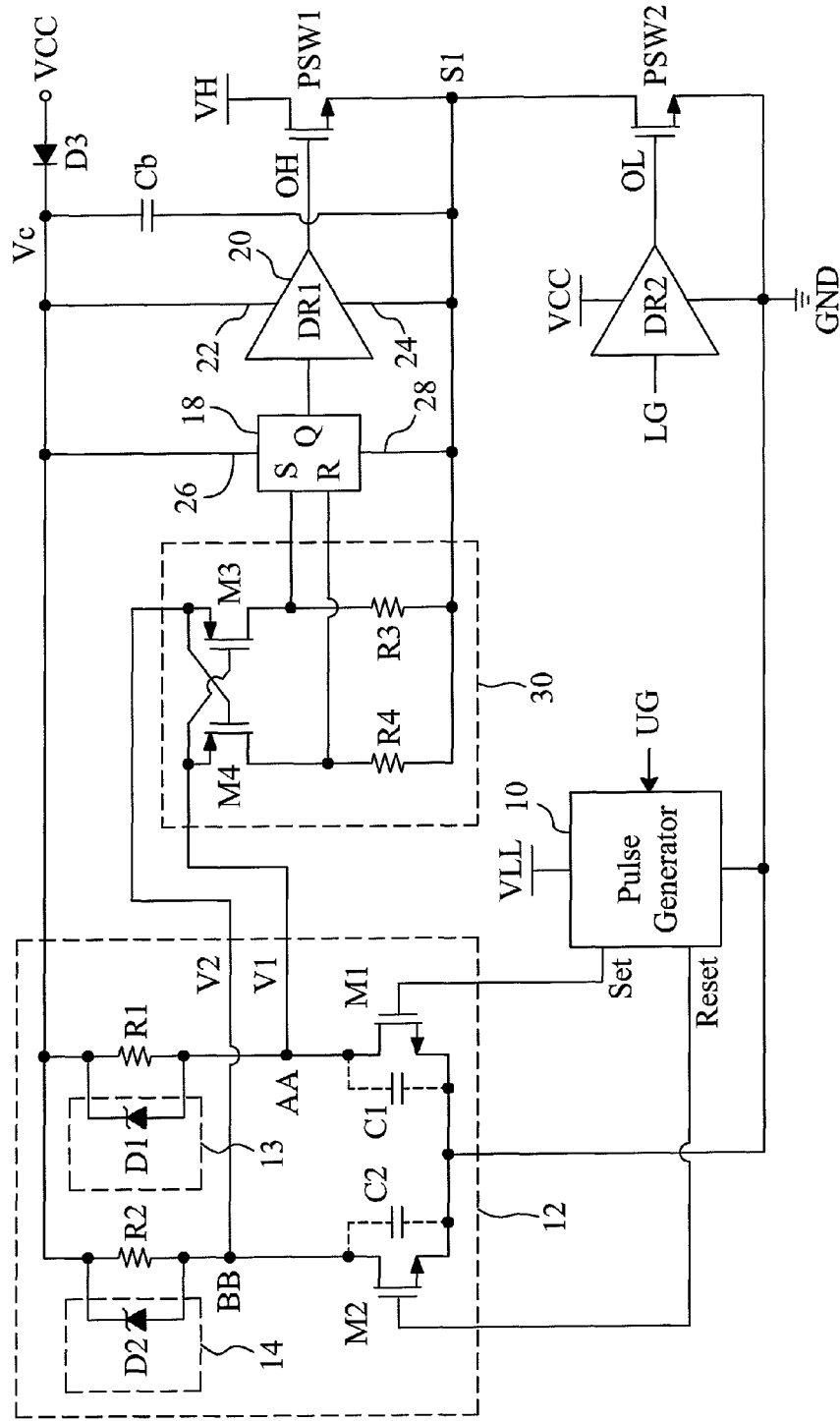
FIG. 2 is a circuit diagram of another conventional floating gate driver circuit.
Figure 3:
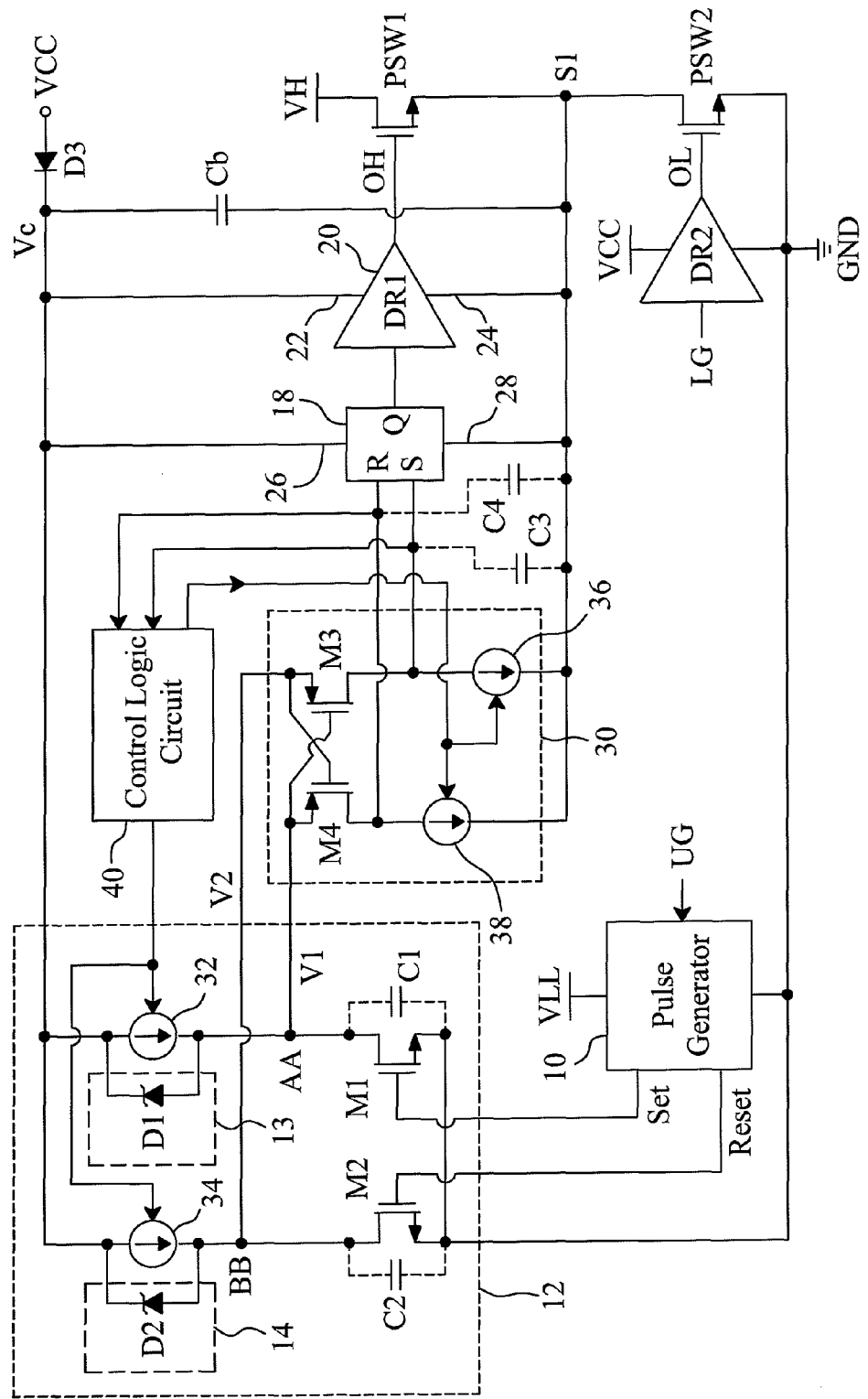
FIG. 3 is a circuit diagram of a first embodiment according to the present invention.

FIG. 3 is a circuit diagram of an embodiment based on the circuit of FIG. 2 for illustrating the principles and scopes of the present invention, in which the loads of the level shifter 12 are replaced by current sources 32 and 34, and the loads of the pass element 30 are replaced by current sources 36 and 38. In addition, a control logic circuit 40 is provided to dynamically control the current sources 32, 34, 36 and 38 according to the voltages at the input terminals S and R of the bistable circuit 18.

Figure 4:
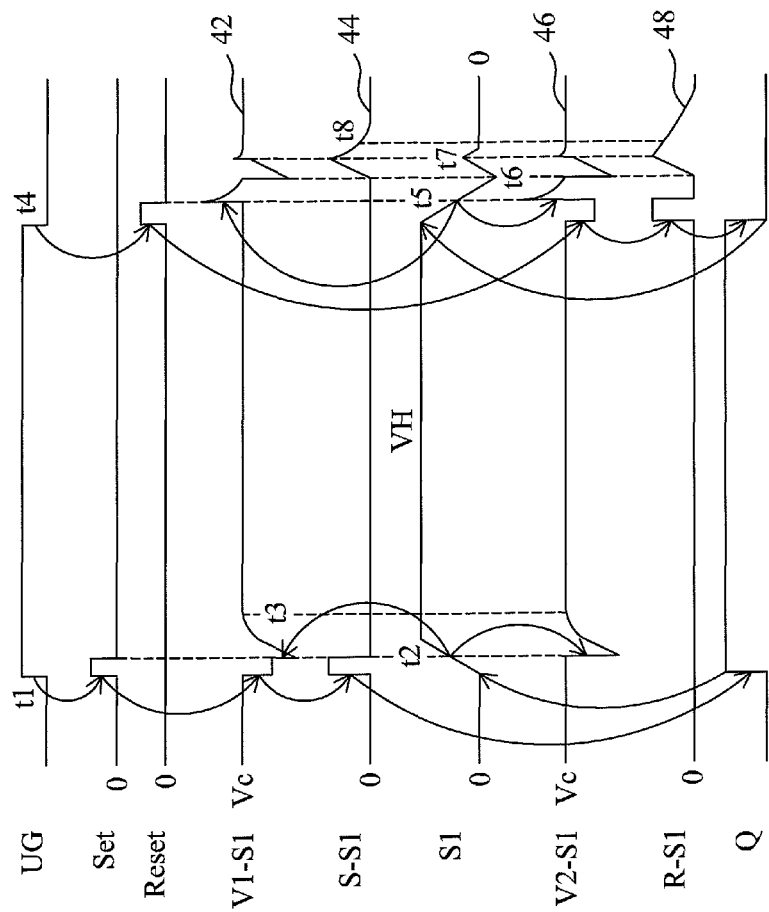
FIG. 4 is a waveform diagram of the circuit shown in FIG. 3 when the power switch is switched.

FIG. 4 is a waveform diagram of the circuit shown in FIG. 3 when the power switch PSW1 is switched once. As this floating gate driver circuit uses the voltage at the floating node S1 as the reference potential, the waveforms 42, 44, 46 and 48 represent V1-S1, S-S1, V2-S1 and R-S1, respectively. Referring to FIG. 4 in conjunction with FIG. 3, responsive to the control signal UG changing from logic 0 to logic 1 at time t1, the pulse generator 10 triggers the short-pulse signal Set to turn on the NMOSFET M1, causing the voltage V1 to fall down. Consequently, the PMOSFET M3 is turned on, and the voltage V2 pulls high the set signal S to a level such that the bistable circuit 18 triggers the control signal Q. Responsive thereto, the driver 20 turns on the power switch PSW1. Once the power switch PSW1 is turned on, the voltage at the floating node S1 raises from zero, and due to the bootstrap capacitor Cb, the supply voltage Vc of the level shifter 12 is pulled up. The resultant dv/dt noise causes a decrease in the voltages V1 and V2, as shown at time t2. However, the PMOSFETs M3 and M4 remain off at this moment because both the gate-source voltage of the PMOSFET M3 and the gate-source voltage of the PMOSFET M4 are greater than their respective threshold voltages Vt. Therefore, neither the voltage V1 nor the voltage V2 can be delivered to the reset terminal R or the set terminal S of the bistable circuit 18, and the control signal Q is kept high, preventing incorrect operation caused by the dv/dt noise. Moreover, the control logic circuit 40 detects the logical state SR=10, it will increase the currents of the current sources 32 and 34 within a predetermined time such that the voltages V1 and V2 are rapidly stabilized. Thus, the time of influence of the dv/dt noise is minimized, as shown in FIG. 4 by the period from t2 to t3. At time t4, the control signal UG changes from logic 1 to logic 0, so the pulse generator 10 triggers the short-pulse signal Reset to turn on the NMOSFET M2, causing a drop in the voltage V2 and thereby turning on the PMOSFET M4 to pull high the reset signal R to a level such that the bistable circuit 18 turns off the control signal Q. Consequently, the driver 20 turns off the power switch PSW1. Once the power switch PSW1 is turned off and the power switch PSW2 is turned on, the voltage at the floating node S1 falls down from VH, causing a rise in the voltages V1 and V2, as shown at time t5. Since at this moment the gate-source voltage of the PMOSFET M3 and the gate-source voltage of the PMOSFET M4 are greater than their respective threshold voltages Vt, the PMOSFETs M3 and M4 remain off, thus neither the voltage V1 nor the voltage V2 can be delivered to the reset terminal R or the set terminal S of the bistable circuit 18. The control signal Q is therefore kept low, and the power switch PSW1 remains off; in other words, incorrect operation of the power switch PSW1 caused by the dv/dt noise has been ruled out. At time t6, the voltage at the floating node S1 begins to rebound, causing a decrease in the voltages V1 and V2. However, since the gate voltage and the source voltage of each of the PMOSFETs M3 and M4 are substantially equal at this moment, the PMOSFETs M3 and M4 remain off. Therefore, the reset terminal R and the set terminal S are not affected by the voltages V1 and V2, although the voltages at the set terminal S and at the reset terminal R will increase due to their respective parasitic capacitors C3 and C4. At time t7, the voltage at the floating node S1 goes down again, and the voltages at the reset terminal R and at the set terminal S fall accordingly. Nevertheless, the control logic circuit 40 controls the current of the current source 36 to increase and controls the current of the current source 38 to decrease. In consequence, the voltage at the set terminal S decreases faster than the voltage at the reset terminal R, as shown at time t8. This ensures that the logical state SR=10 will not occur when the control signal Q is terminated; therefore, the power switch PSW1 remains off.

While the timing and waveforms of the signals associated with the switching of the power switch PSW1 are shown in FIG. 4 in an exaggerated manner, the aforesaid characteristics are sure to be found in different embodiments. That is to say, the time of influence of the dv/dt noise will be minimized when the control signal Q is turned on, and the voltage at the set terminal S will decrease more rapidly than the voltage at the reset terminal R when the control signal Q is terminated. Besides, it is feasible for the control logic circuit 40 in a different embodiment can only decrease the current of the current source 36 or only increase the current of the current source 38. In either case, a faster decrease of the voltage at the set terminal S than at the reset terminal R can be achieved.

Figure 5:
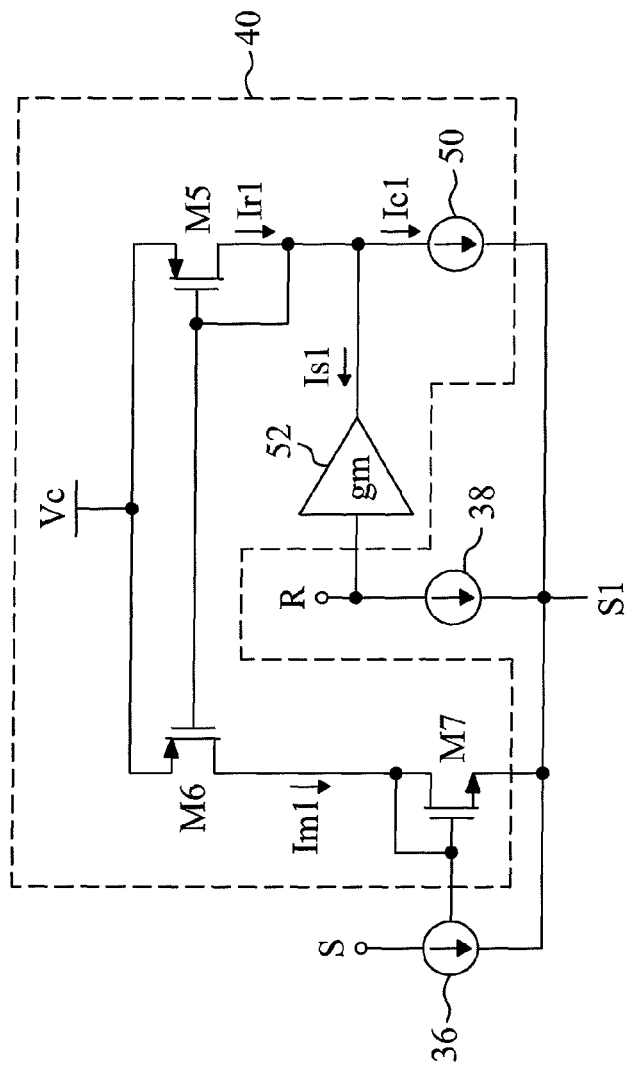
FIG. 5 is a circuit diagram of a first embodiment for the control logic circuit shown in FIG. 3.

FIG. 5 is a circuit diagram of an embodiment for the control logic circuit 40 to illustrate how to control the current source 36, in which a current source 50 provides a current Ic1, PMOSFETs M5 and M6 establish a current mirror and are connected to the current source 50 and an NMOSFET M7, respectively, and a transconductance amplifier 52 has an input terminal and an output terminal connected to the reset terminal R of the bistable circuit 18 and a drain of the PMOSFET M5, respectively, to convert the voltage at the reset terminal R to a current Is1. Hence, the PMOSFET M5 establishes a current Ir1=Ic1+Is1. The PMOSFET M6 mirrors the current Ir1 to generate a current Im1, which is equal to the current of the NMOSFET M7. The NMOSFET M7 and the current source 36 establish a current mirror to control the current source 36. When the voltage at the reset terminal R increases, the current Is1 drained by the transconductance amplifier 52 increases, and thus the current Ir1 increases, and so is the current Im1. As a result, the current provided by the current source 36 increases.

Figure 6:
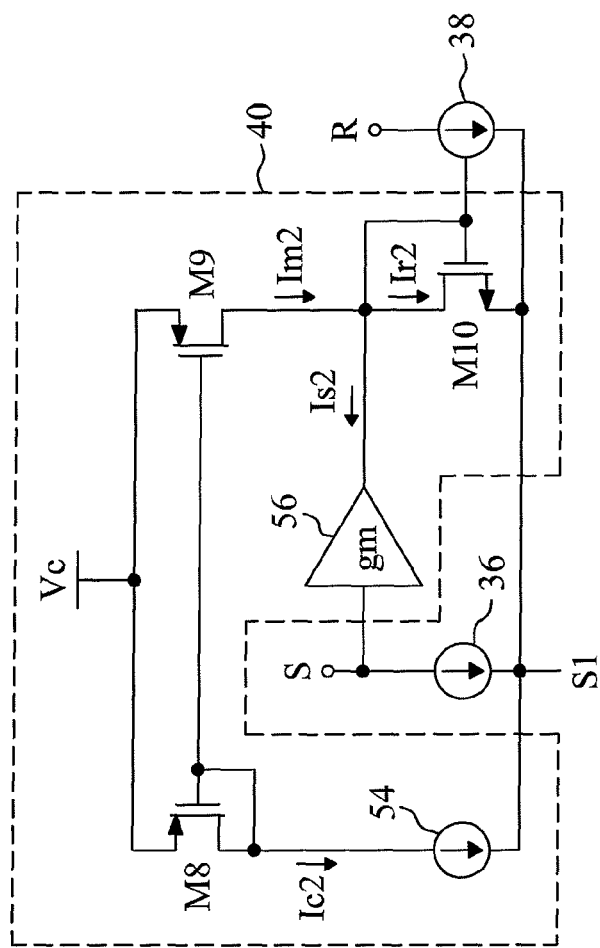
FIG. 6 is a circuit diagram of a second embodiment for the control logic circuit shown in FIG. 3.

FIG. 6 is a circuit diagram of another embodiment for the control logic circuit 40 to illustrate how to control the current source 38, in which a current source 54 provides a current Ic2, PMOSFETs M8 and M9 establish a current mirror and are connected to the current source 54 and a NMOSFET M10, respectively, to mirror the current Ic2 to generate a current Im2, and a transconductance amplifier 56 has an input terminal and an output terminal connected to the set terminal S of the bistable circuit 18 and a drain of the PMOSFET M9, respectively, to convert the voltage at the set terminal S to a current Is2. Hence, the PMOSFET M10 establishes a current Ir2=Im2−Is2. The NMOSFET M10 and the current source 38 establish a current mirror to control the current source 38. When the voltage at the set terminal S increases, the current Is2 increases, causing the current Ir2 to decrease, resulting in a reduction in the current provided by the current source 38.

The control logic circuits 40 shown in FIGS. 5 and 6 can be so designed that the transconductance amplifiers 52 and 56 are activated when the logic R=1. Thus, the logical state SR=11 can be avoided.

Figure 7:
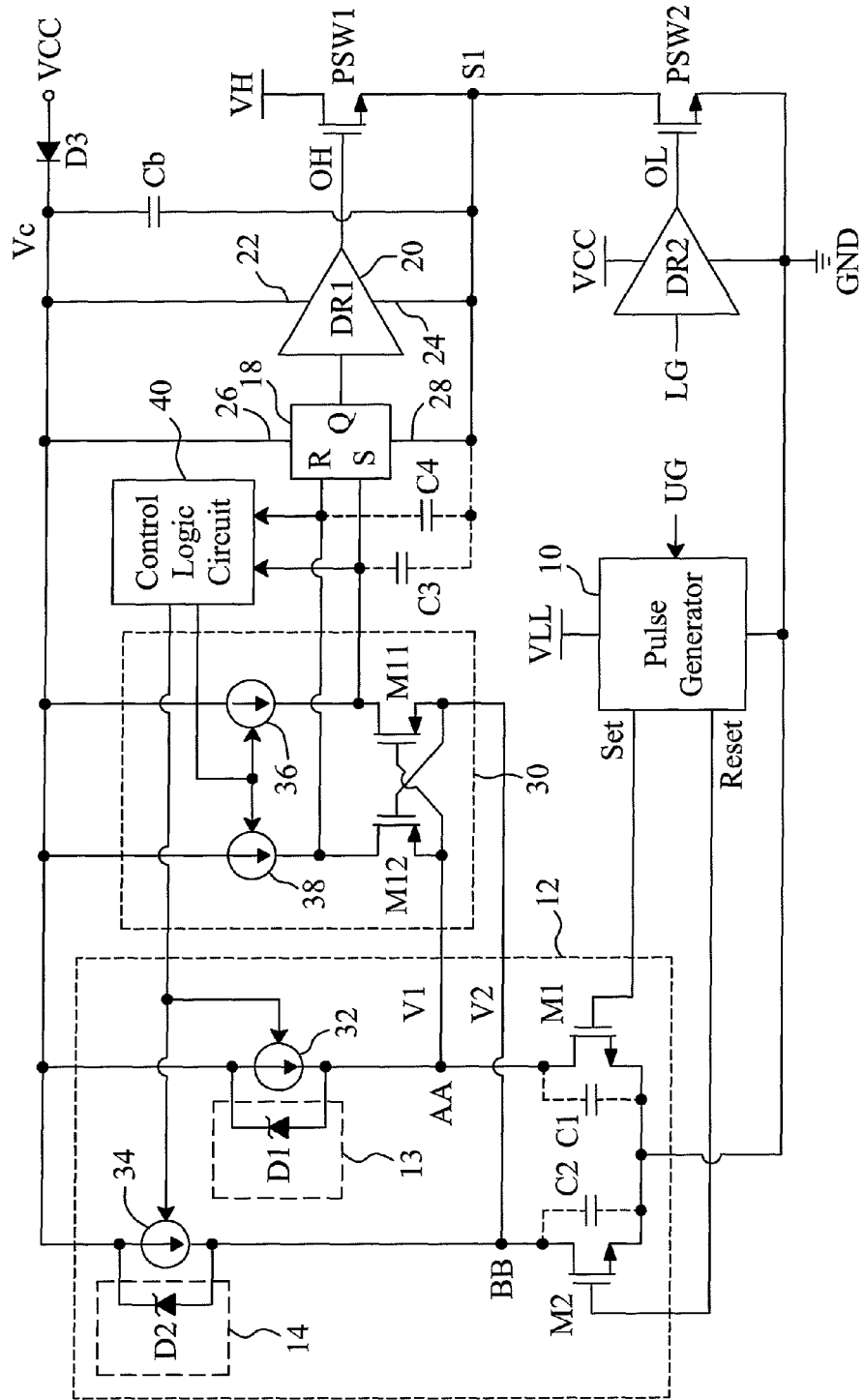
FIG. 7 is a circuit diagram of a second embodiment according to the present invention.

In a different embodiment as shown in FIG. 7, NMOSFETs M11 and M12 are used in lieu of the PMOSFETs M3 and M4 shown in FIG. 3. Moreover, the source of the NMOSFET M11 and the gate of the NMOSFET M12 are connected to the output terminal BB of the level shifter 12, and the source of the NMOSFET M12 and the gate of the NMOSFET M11 are connected to the output terminal AA of the level shifter 12. Also, the current sources 36 and 38, which serve as the loads of the NMOSFETs M11 and M12, are now located between the power supply terminal Vc and the drain of the NMOSFET M11, and between the power supply terminal Vc and the drain of the NMOSFET M12, respectively. The operations and principles of this circuit is the same as that of the embodiment shown in FIG. 3.

Figure 1:
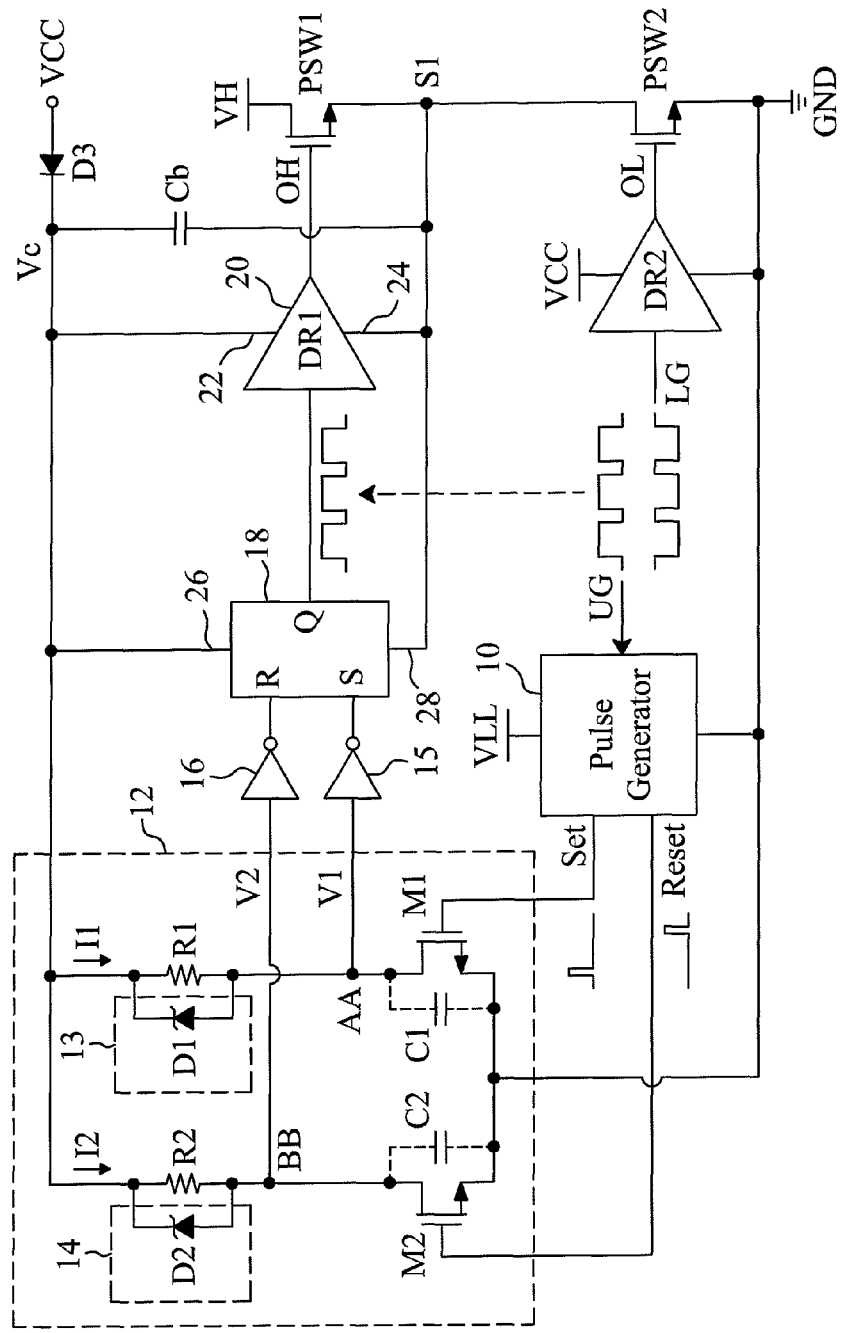
FIG. 1 is a circuit diagram of a conventional floating gate driver circuit.

In other embodiments, it is also feasible to substitute the current sources 32, 34, 36 and 38 shown in FIGS. 3 and 7 with programmable impedance devices, for example variable resistors or transistors. The impedances of the programmable impedance devices are dynamically controlled by the control logic circuit 40 to change the currents of the programmable impedance devices. Thus, the time of influence of the dv/dt noise can be minimized when the control signal Q is turned on, and the voltage at the set terminal S will decrease faster than the voltage at the reset terminal R when the control signal Q is terminated. Further, the current sources 32 and 34 may also be replaced by the resistors R1 and R2 shown in the circuit of FIG. 1.

Since the currents of the loads of the level shifter 12 and of the pass element 30 are controlled by the control logic circuit 40 when the power switch PSW1 is switched, the circuit has high flexibility in design. Those important factors of the circuit, such as the time required to re-stabilize the voltages V1 and V2 and the speeds at which the voltages at the set terminal S and at the reset terminal R of the bistable circuit 18 decrease, can be changed simply by modifying or adjusting the design values of the control logic circuit 40.

Figure 8:
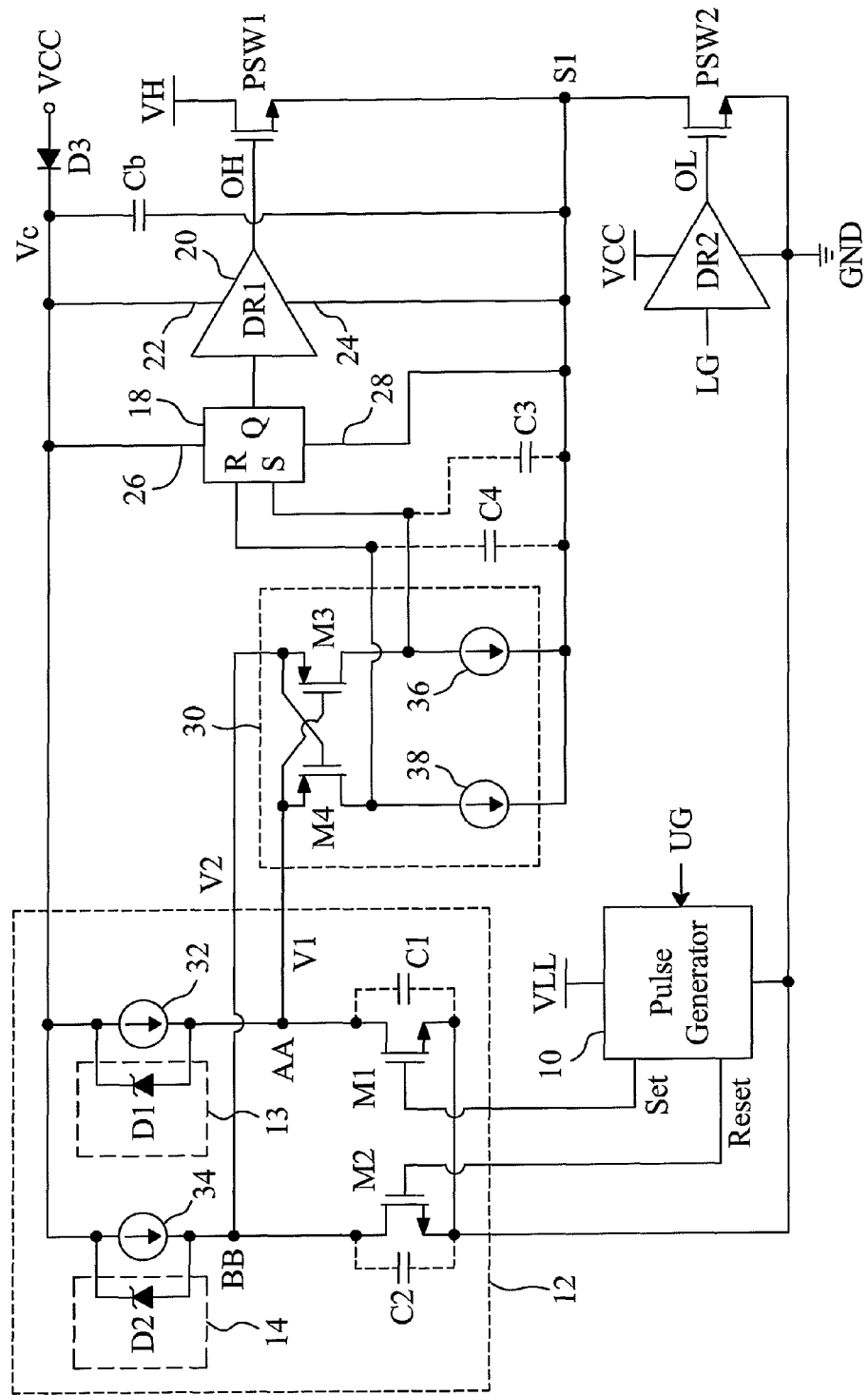
FIG. 8 is a circuit diagram of a third embodiment according to the present invention.

FIG. 8 is a circuit diagram of a third embodiment according to the present invention, in which the control logic circuit 40 has been dispensed with to reduce the circuit area and cost. In this embodiment, all of the current sources 32, 34, 36 and 38 provide constant currents. However, the current provided by the current source 36 is greater than that provided by the current source 38 so as for the voltage at the set terminal S to decrease at a higher speed than the voltage at the reset terminal R when the control signal Q is terminated.

Figure 9:
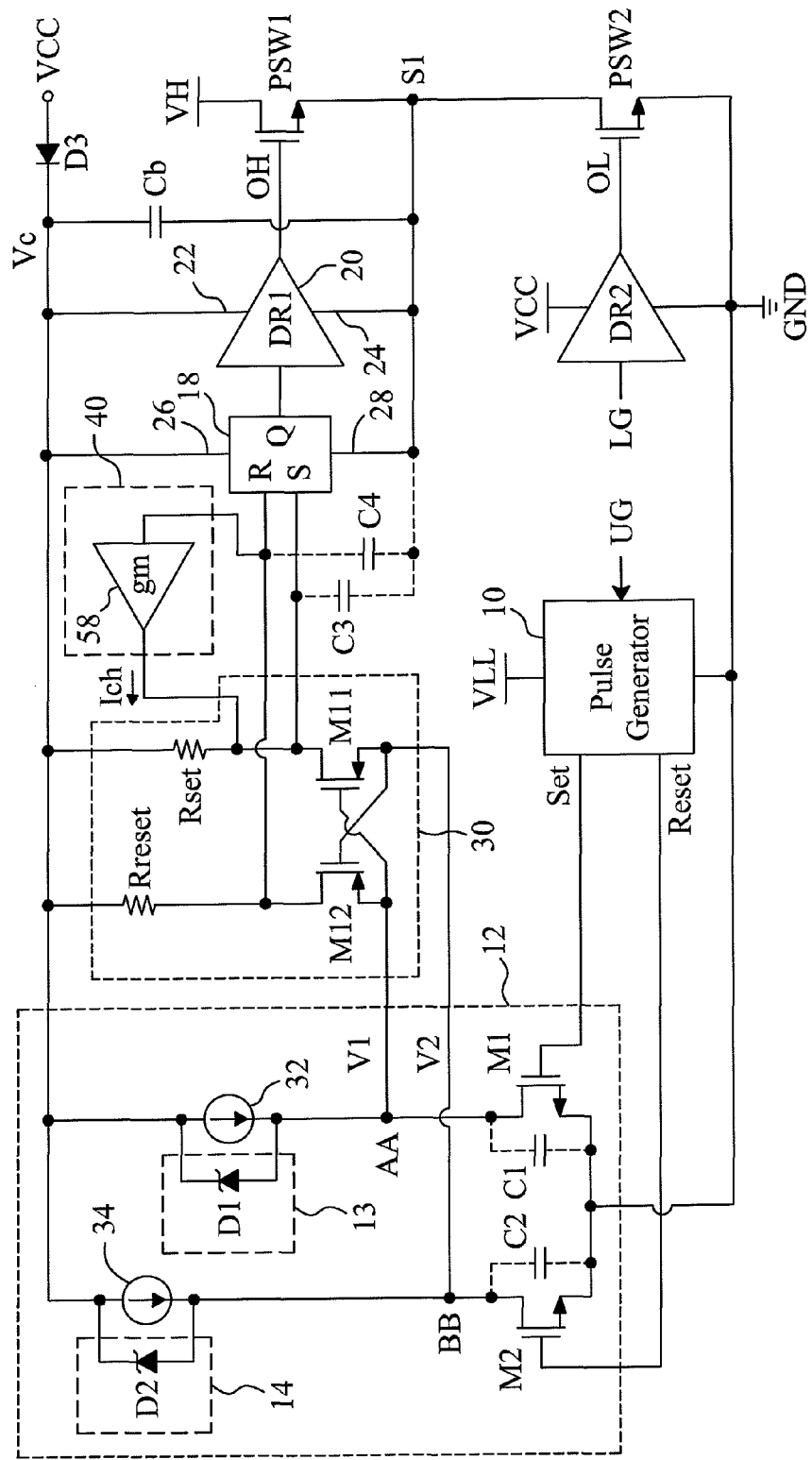
FIG. 9 is a circuit diagram of a fourth embodiment according to the present invention.

FIG. 9 is a circuit diagram of a fourth embodiment according to the present invention, which is a modified version of the circuit depicted in FIG. 7. In the circuit of FIG. 9, the resistors Rset and Rreset are used in place of the current sources 36 and 38, respectively, and have a substantially same resistance. In addition, the control logic circuit 40 includes a transconductance amplifier 58 to determine a current Ich according to the voltage at the reset terminal R in order to increase the current at the set terminal S, and consequently the charging speed of the set terminal S increases. Hence, when the control signal Q is terminated, the voltage at the set terminal S will increase faster than the voltage at the reset terminal R. This ensures that the logic state SR=10 will not occur when the control signal Q is terminated, and because of that, the power switch PSW1 will remain off. In a different embodiment, the transconductance amplifier 58 may also be configured to cause a faster increase in the voltage at the set terminal S than at the reset terminal R by reducing the current at the reset terminal R.

Figure 10:
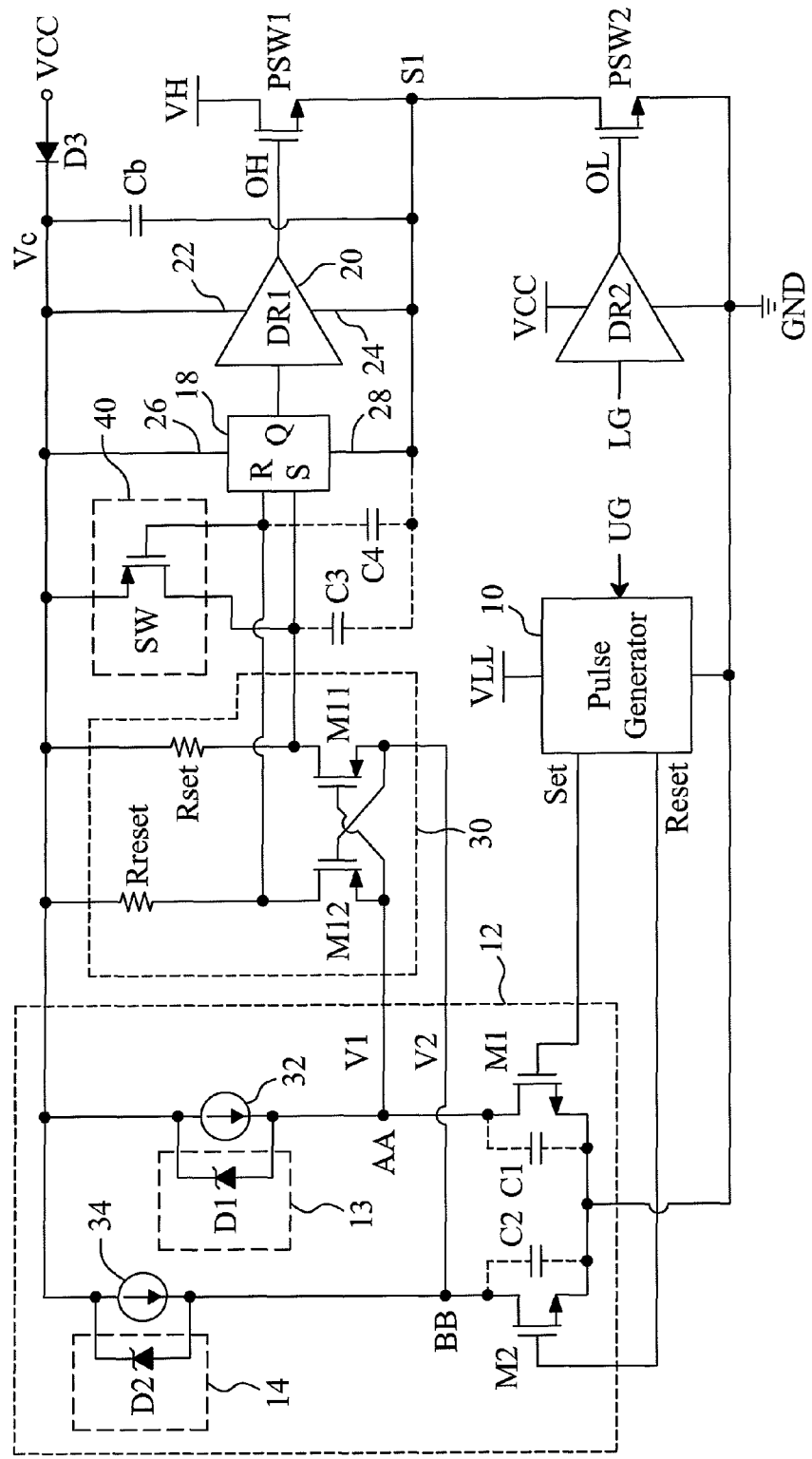
FIG. 10 is a circuit diagram of a fifth embodiment according to the present invention.

FIG. 10 is a circuit diagram of a fifth embodiment according to the present invention, which is a modified version of the circuit depicted in FIG. 9. In the circuit of FIG. 10, the control logic circuit 40 includes a switch SW connected between the power supply terminal Vc and the set terminal S. The control terminal of the switch SW is connected to the reset terminal R so that the switch SW is switched responsive to the voltage at the reset terminal R When the control signal Q is terminated, the switch SW is turned on to allow a faster increase in the voltage at the set terminal S than at the reset terminal R. Thus, it can be assured that the logic state SR=10 will not occur when the control signal Q is terminated and that the power switch PSW1 will remain off as a result.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A floating gate driver circuit comprising:
a driver connected to a power supply terminal and a floating node;
a bistable circuit connected to the driver, the power supply terminal and the floating node, and having a first input terminal to receive a first logic signal and a second input terminal to receive a second logic signal to thereby define a control signal for the driver;
a pass element connected to the power supply terminal or the floating node, having a first input terminal to receive a first voltage, a second input terminal to receive a second voltage, a first output terminal connected to the first input terminal of the bistable circuit, and a second output terminal connected to the second input terminal of the bistable circuit, to thereby generate the first logic signal and the second logic signal according to the first voltage and the second voltage, and including a first load connected to the first output terminal of the pass element and a second load connected to the second output terminal of the pass element;
a level shifter connected to the pass element and the power supply terminal, and having a first output terminal to provide the first voltage and a second output terminal to provide the second voltage; and
a control logic circuit connected to the first input terminal and the second input terminal of the bistable circuit and to the first load and the second load of the pass element, and operative to control at least one of the first load and the second load of the pass element according to a voltage at the first input terminal of the bistable circuit and a voltage at the second input terminal of the bistable circuit;
wherein each of the first load and the second load of the pass element includes a current source, a transistor, or a programmable impedance device.

2. The floating gate driver circuit of claim 1, wherein the control logic circuit comprises a transconductance amplifier connected to the second input terminal of the bistable circuit, and detecting the voltage at the second input terminal of the bistable circuit to control the first load of the pass element.

3. The floating gate driver circuit of claim 1, wherein the control logic circuit comprises a transconductance amplifier connected to the first input terminal of the bistable circuit, and detecting the voltage at the first input terminal of the bistable circuit to control the second load of the pass element.

4. The floating gate driver circuit of claim 1, wherein the control logic circuit comprises a transconductance amplifier connected to the second input terminal of the bistable circuit, and detecting the voltage at the second input terminal of the bistable circuit to control a current charging the first input terminal of the bistable circuit.

5. The floating gate driver circuit of claim 1, wherein the level shifter comprises:
a first load connected between the power supply terminal and the first output terminal of the level shifter; and
a second load connected between the power supply terminal and the second output terminal of the level shifter.

6. The floating gate driver circuit of claim 5, wherein each of the first load and the second load of the level shifter includes a current source, a transistor, a resistor, or a programmable impedance devices controlled by the control logic circuit.

7. A method for improving noise immunity of a floating gate driver circuit including a driver connected to a power supply terminal and a floating node, a bistable circuit connected to the driver, the power supply terminal and the floating node, and having a first input terminal to receive a first logic signal and a second input terminal to receive a second logic signal to thereby define a control signal for the driver, a pass element connected to the power supply terminal or the floating node, and having a first input terminal to receive a first voltage, a second input terminal to receive a second voltage, a first output terminal connected to the first input terminal of the bistable circuit, and a second output terminal connected to the second input terminal of the bistable circuit, to thereby generate the first logic signal and the second logic signal according to the first voltage and the second voltage, and a level shifter connected to the pass element and the power supply terminal, and having a first output terminal to provide the first voltage and a second output terminal to provide the second voltage, the method comprising steps of:
A) detecting a voltage at the first input terminal or the second input terminal of the bistable circuit; and
B) controlling at least one of a first load and a second load of the pass element according to the detected voltage.

8. The method of claim 7, wherein the step B comprises a step of controlling the first input terminal of the bistable circuit to have a higher discharging speed than the second input terminal of the bistable circuit at a time of terminating the control signal.

9. The method of claim 7, wherein the step B comprises a step of controlling the first input terminal of the bistable circuit to have a higher charging speed than the second input terminal of the bistable circuit at a time of terminating the control signal.

10. The method of claim 7, wherein the step B comprises a step of increasing a current of the first load of the pass element at a time of terminating the control signal.

11. The method of claim 7, wherein the step B comprises a step of decreasing a current of the second load of the pass element at a time of terminating the control signal.

12. The method of claim 7, wherein the step B comprises a step of decreasing an impedance of the first load of the pass element at a time of terminating the control signal.

13. The method of claim 7, wherein the step B comprises a step of increasing an impedance of the second load of the pass element at a time of terminating the control signal.

14. The method of claim 7, further comprising a step of controlling a first load and a second load of the level shifter according to the detected voltage.

15. The method of claim 7, further comprising a step of increasing a current of a first load of the level shifter and a current of a second load of the level shifter at a time of triggering the control signal.

16. A floating gate driver circuit comprising:
a driver connected to a power supply terminal and a floating node;
a bistable circuit connected to the driver, the power supply terminal and the floating node, and having a first input terminal to receive a first logic signal and a second input terminal to receive a second logic signal to thereby define a control signal for the driver;
a pass element connected to the power supply terminal or the floating node, having a first input terminal to receive a first voltage, a second input terminal to receive a second voltage, a first output terminal connected to the first input terminal of the bistable circuit, and a second output terminal connected to the second input terminal of the bistable circuit, to thereby generate the first logic signal and the second logic signal according to the first voltage and the second voltage, and including a first load connected to the first output terminal of the pass element and a second load connected to the second output terminal of the pass element;

a level shifter connected to the pass element and the power supply terminal, having a first output terminal to provide the first voltage and a second output terminal to provide the second voltage, and including a first load connected between the power supply terminal and the first output terminal of the level shifter, and a second load connected between the power supply terminal and the second output terminal of the level shifter; and a control logic circuit connected to the first input terminal and the second input terminal of the bistable circuit and to the first load and the second load of the level shifter, and operative to control the first load and the second load of the level shifter according to a voltage at the first input terminal of the bistable circuit and a voltage at the second input terminal of the bistable circuit;

wherein each of the first load and the second load of the pass element includes a current source, a transistor, or a programmable impedance device, and each of the first load and the second load of the level shifter includes a current source, a transistor, a resistor, or a programmable impedance device.

17. The floating gate driver circuit of claim 16, wherein the control logic circuit increases the first load and the second load of the level shifter at a time of triggering the control signal.

18. The floating gate driver circuit of claim 16, wherein the control logic circuit comprises a transconductance amplifier connected to the second input terminal of the bistable circuit, and detecting the voltage at the second input terminal of the bistable circuit to control the first load of the pass element.

19. The floating gate driver circuit of claim 16, wherein the control logic circuit comprises a transconductance amplifier connected to the first input terminal of the bistable circuit, and detecting the voltage at the first input terminal of the bistable circuit to control the second load of the pass element.

20. The floating gate driver circuit of claim 16, wherein the control logic circuit comprises a transconductance amplifier connected to the second input terminal of the bistable circuit, and detecting the voltage at the second input terminal of the bistable circuit to control a current charging the first input terminal of the bistable circuit.

21. A method for improving noise immunity of a floating gate driver circuit including a driver connected to a power supply terminal and a floating node, a bistable circuit connected to the driver, the power supply terminal and the floating node, and having a first input terminal to receive a first logic signal and a second input terminal to receive a second logic signal to thereby define a control signal for the driver, a pass element connected to the power supply terminal or the floating node, and having a first input terminal to receive a first voltage, a second input terminal to receive a second voltage, a first output terminal connected to the first input terminal of the bistable circuit, and a second output terminal connected to the second input terminal of the bistable circuit, to thereby generate the first logic signal and the second logic signal according to the first voltage and the second voltage, and a level shifter connected to the pass element and the power supply terminal, and having a first output terminal to provide the first voltage and a second output terminal to provide the second voltage, the method comprising steps of:

A.) detecting a voltage at the first input terminal or the second input terminal of the bistable circuit; and B.) controlling a first load and a second load of the level shifter according to the voltage detected.

22. The method of claim 21, wherein the step B comprises a step of increasing a current of the first load of the level shifter and a current of the second load of the level shifter at a time of triggering the control signal.

23. The method of claim 21, further comprising a step of controlling the first input terminal of the bistable circuit to have a higher discharging speed than the second input terminal of the bistable circuit at a time of terminating the control signal.

24. The method of claim 21, further comprising a step of controlling the first input terminal of the bistable circuit to have a higher charging speed than the second input terminal of the bistable circuit at a time of terminating the control signal.

25. The method of claim 21, further comprising a step of increasing a current of a first load of the pass element at a time of terminating the control signal.

26. The method of claim 21, further comprising a step of decreasing a current of a second load of the pass element at a time of terminating the control signal.

27. The method of claim 21, further comprising a step of decreasing an impedance of a first load of the pass element at a time of terminating the control signal.

28. The method of claim 21, further comprising a step of increasing an impedance of a second load of the pass element at a time of terminating the control signal.

29. A floating gate driver circuit comprising:

a driver connected to a power supply terminal and a floating node;

a bistable circuit connected to the driver, the power supply terminal and the floating node, and having a first input terminal to receive a first logic signal and a second input terminal to receive a second logic signal to thereby define a control signal for the driver;

a pass element connected to the power supply terminal or the floating node, having a first input terminal to receive a first voltage, a second input terminal to receive a second voltage, a first output terminal connected to the first input terminal of the bistable circuit, and a second output terminal connected to the second input terminal of the bistable circuit, to thereby generate the first logic signal and the second logic signal according to the first voltage and the second voltage, and including a first load connected to the first output terminal of the pass element and a second load connected to the second output terminal of the pass element; and a level shifter connected to the pass element and the power supply terminal, having a first output terminal to provide the first voltage and a second output terminal to provide the second voltage, and including a first load connected between the power supply terminal and the first output terminal of the level shifter and a second load connected between the power supply terminal and the second output terminal of the level shifter;

wherein each of the first load and the second load of the pass element and the first load and the second load of the level shifter includes an active current source or a transistor;

wherein the first input terminal and the second input terminal of the bistable circuit are a set terminal and a reset terminal of the bistable circuit respectively, and a current of the first load of the pass element is greater than a current of the second load of the pass element when the control signal is terminated.

30. A floating gate driver circuit comprising:
a driver connected to a power supply terminal and a floating node;
a bistable circuit connected to the driver, the power supply terminal and the floating node, and having a set terminal to receive a first logic signal and a reset terminal to receive a second logic signal to thereby define a control signal for the driver;
a pass element connected to the power supply terminal or the floating node, having a first input terminal to receive a first voltage, a second input terminal to receive a second voltage, a first output terminal connected to the set terminal, and a second output terminal connected to the reset terminal, to thereby generate the first logic signal and the second logic signal according to the first voltage and the second voltage, and including:
a first NMOSFET having a source to receive the first voltage, and a drain connected to the first output terminal of the pass element;
a second NMOSFET having a source to receive the second voltage and connected to a gate of the first NMOSFET, a drain connected to the second output terminal of the pass element, and a gate connected to the source of the first NMOSFET;
a first resistor as a first load connected between the first output terminal of the pass element and the power supply terminal; and
a second resistor as a second load connected between the second output terminal of the pass element and the power supply terminal;
a level shifter connected to the pass element and the power supply terminal, and having a first output terminal to provide the first voltage and a second output terminal to provide the second voltage; and
a control logic circuit including a transconductance amplifier for increasing a current at the set terminal or decreasing a current at the reset terminal such that the set terminal has a faster increasing voltage than the reset terminal.

31. The floating gate driver circuit of claim 30, wherein the first resistor and the second resistor have a substantially same resistance.

32. A floating gate driver circuit comprising:
a driver connected to a power supply terminal and a floating node;
a bistable circuit connected to the driver, the power supply terminal and the floating node, and having a set terminal to receive a first logic signal and a reset terminal to receive a second logic signal to thereby define a control signal for the driver;
a pass element connected to the power supply terminal or the floating node, having a first input terminal to receive a first voltage, a second input terminal to receive a second voltage, a first output terminal connected to the set terminal of the bistable circuit, and a second output terminal connected to the reset terminal of the bistable circuit, to thereby generate the first logic signal and the second logic signal according to the first voltage and the second voltage, and including:
a first NMOSFET having a source to receive the first voltage, and a drain connected to the first output terminal of the pass element;
a second NMOSFET having a source to receive the second voltage and connected to a gate of the first NMOSFET, a drain connected to the second output terminal of the pass element, and a gate connected to the source of the first NMOSFET;
a first resistor as a first load connected between the first output terminal of the pass element and the power supply terminal; and
a second resistor as a second load connected between the second output terminal of the pass element and the power supply terminal;
wherein the first resistor and the second resistor have a substantially same resistance;
a level shifter connected to the pass element and the power supply terminal, and having a first output terminal to provide the first voltage and a second output terminal to provide the second voltage; and
a control logic circuit including a switch connected between the power supply terminal and the set terminal and having a control terminal connected to the reset terminal to be switched by a voltage at the reset terminal such that the set terminal has a faster increasing voltage than the reset terminal.

* * * * *